(12) United States Patent
Zuniga et al.

(10) Patent No.: US 11,745,227 B2
(45) Date of Patent: Sep. 5, 2023

(54) SUBSTRATE CLEANING DEVICES AND METHODS THEREOF

(71) Applicant: Applied Materials, Inc, Santa Clara, CA (US)

(72) Inventors: Steven M. Zuniga, Soquel, CA (US); Jay Gurusamy, Santa Clara, CA (US); Jagan Rangarajan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 47 days.

(21) Appl. No.: 16/777,432

(22) Filed: Jan. 30, 2020

(65) Prior Publication Data

US 2020/0246841 A1 Aug. 6, 2020

Related U.S. Application Data

(60) Provisional application No. 62/799,745, filed on Jan. 31, 2019.

(51) Int. Cl.
*B08B 1/00* (2006.01)
*B08B 3/08* (2006.01)
(Continued)

(52) U.S. Cl.
CPC ................ *B08B 1/002* (2013.01); *B08B 3/08* (2013.01); *H01L 21/02041* (2013.01); *H01L 21/67046* (2013.01); *H01L 21/67051* (2013.01)

(58) Field of Classification Search
CPC ........... B08B 1/002; B08B 1/008; B08B 3/08; B08B 1/006; H01L 21/67046;
(Continued)

(56) References Cited

U.S. PATENT DOCUMENTS 5,868,857 A * 2/1999 Moinpour ............... B24B 9/065
15/97.1
5,933,902 A * 8/1999 Frey .......................... B08B 1/04
15/97.1
(Continued)

FOREIGN PATENT DOCUMENTS

CN 207981685 10/2018
CN 207981685 U * 10/2018
(Continued)

OTHER PUBLICATIONS

CN207981685U machine translation (Year: 2018).*
(Continued)

*Primary Examiner* — Douglas Lee
(74) *Attorney, Agent, or Firm* — Fish & Richardson P.C.

(57) ABSTRACT

A substrate cleaning device may include a chamber body configured to hold a substrate and a brush assembly. The brush assembly may include a first roller, a second roller, and a belt extending between the first roller and the second roller. At least one of the first roller and the second roller may be movable between a first position where the belt contacts a first surface of a substrate disposed in the chamber body and a second position where the belt is spaced from the first surface. Other substrate cleaning devices and methods of cleaning substrates are disclosed.

14 Claims, 8 Drawing Sheets

(51) Int. Cl.
*H01L 21/02* (2006.01)
*H01L 21/67* (2006.01)

(58) Field of Classification Search
CPC ......... H01L 21/02041; H01L 21/67051; A46B 13/001; A46B 13/02
See application file for complete search history.

(56) References Cited

U.S. PATENT DOCUMENTS

| | | | |
|---|---|---|---|
| 6,244,935 B1 | 6/2001 | Birang et al. | |
| 6,368,192 B1 | 4/2002 | Jones et al. | |
| 6,607,425 B1 * | 8/2003 | Kistler | B24B 37/16 451/41 |
| 6,616,509 B1 * | 9/2003 | Frost | B24D 13/02 451/41 |
| 6,616,516 B1 | 9/2003 | Ravkin et al. | |
| 7,077,731 B1 | 7/2006 | Zhang et al. | |
| 9,111,966 B2 | 8/2015 | Kitagawa et al. | |
| 2007/0177891 A1 * | 8/2007 | Honobe | G03G 15/0225 399/100 |
| 2015/0000056 A1 * | 1/2015 | Togawa | H01L 21/67051 15/97.1 |
| 2017/0040160 A1 | 2/2017 | Chen et al. | |

FOREIGN PATENT DOCUMENTS

| | | | |
|---|---|---|---|
| JP | S63-048678 | 3/1988 | |
| JP | 2005081297 A * | 3/2005 | ............... B08B 3/02 |
| JP | 2013-084884 | 5/2013 | |

OTHER PUBLICATIONS

JP2005-081297A machine translation (Year: 2005).*
PCT International Search Report and Written Opinion in International Application No. PCT/US2020.015827, dated May 29, 2020, 11 pages.

* cited by examiner

SUBSTRATE CLEANING DEVICES AND METHODS THEREOF

CROSS-REFERENCE TO RELATED APPLICATIONS

This claims priority to U.S. Application Ser. No. 62/799,745, filed on Jan. 31, 2019, the disclosure of which is incorporated by reference.

FIELD

The present disclosure relates to substrate cleaning devices and methods for operating the same.

BACKGROUND

During semiconductor device fabrication, substrates on which semiconductor devices are fabricated undergo many processes. One such processes is cleaning, wherein the substrates may be placed in brush boxes. Cleaning rollers may be located in the brush boxes and may be rotated against the substrates to clean the substrates.

SUMMARY

In some embodiments, a substrate cleaning device is provided. The substrate cleaning device includes a chamber body configured to hold a substrate; a first brush assembly including a first roller, a second roller, and a first belt extending between the first roller and the second roller, at least one of the first roller and the second roller being movable between a first position where the first belt contacts a first surface of a substrate disposed in the chamber body and a second position where the first belt is spaced from the first surface; and a second brush assembly including a first roller, a second roller, and a second belt extending between the first roller and the second roller, at least one of the first roller and the second roller being movable between a first position where the second belt contacts a second surface of the substrate and a second position where the second belt is spaced from the second surface.

In some embodiments, a method of cleaning substrates is provided. The method may include providing a first brush assembly including a first roller, a second roller, and a first belt extending between the first roller and the second roller; providing a second brush assembly including a first roller, a second roller, and a second belt extending between the first roller and the second roller; rotating the first belt; rotating the second belt; moving at least one of the first roller and the second roller of the first brush assembly to a first position where the first belt contacts a first surface of a substrate; and moving at least one of the first roller and the second roller of the second brush assembly to a first position where the second belt contacts a second surface of the substrate.

In some embodiments, a substrate cleaning device is provided. The substrate cleaning device may include a chamber body configured to hold a substrate; a first brush assembly including a first roller, a second roller, and a belt extending between the first roller and the second roller, at least one of the first roller and the second roller being movable between a first position where the belt contacts a first surface of a substrate disposed in the chamber body and a second position where the belt is spaced from the first surface; and a magnetic coupler located external to the chamber body and magnetically coupled to one of the first roller and the second roller, wherein the magnetic coupler is configured to move one of the first roller and the second roller between the first position and the second position.

Numerous other aspects and features are provided in accordance with these and other embodiments of the disclosure. Other features and aspects of embodiments of the disclosure will become more fully apparent from the following detailed description, the claims, and the accompanying drawings.

BRIEF DESCRIPTION OF DRAWINGS

The drawings, described below, are for illustrative purposes only and are not necessarily drawn to scale. The drawings are not intended to limit the scope of the disclosure in any way. Wherever possible, the same or like reference numbers will be used throughout the drawings to refer to the same or like parts.

DETAILED DESCRIPTION

Figure 1A:
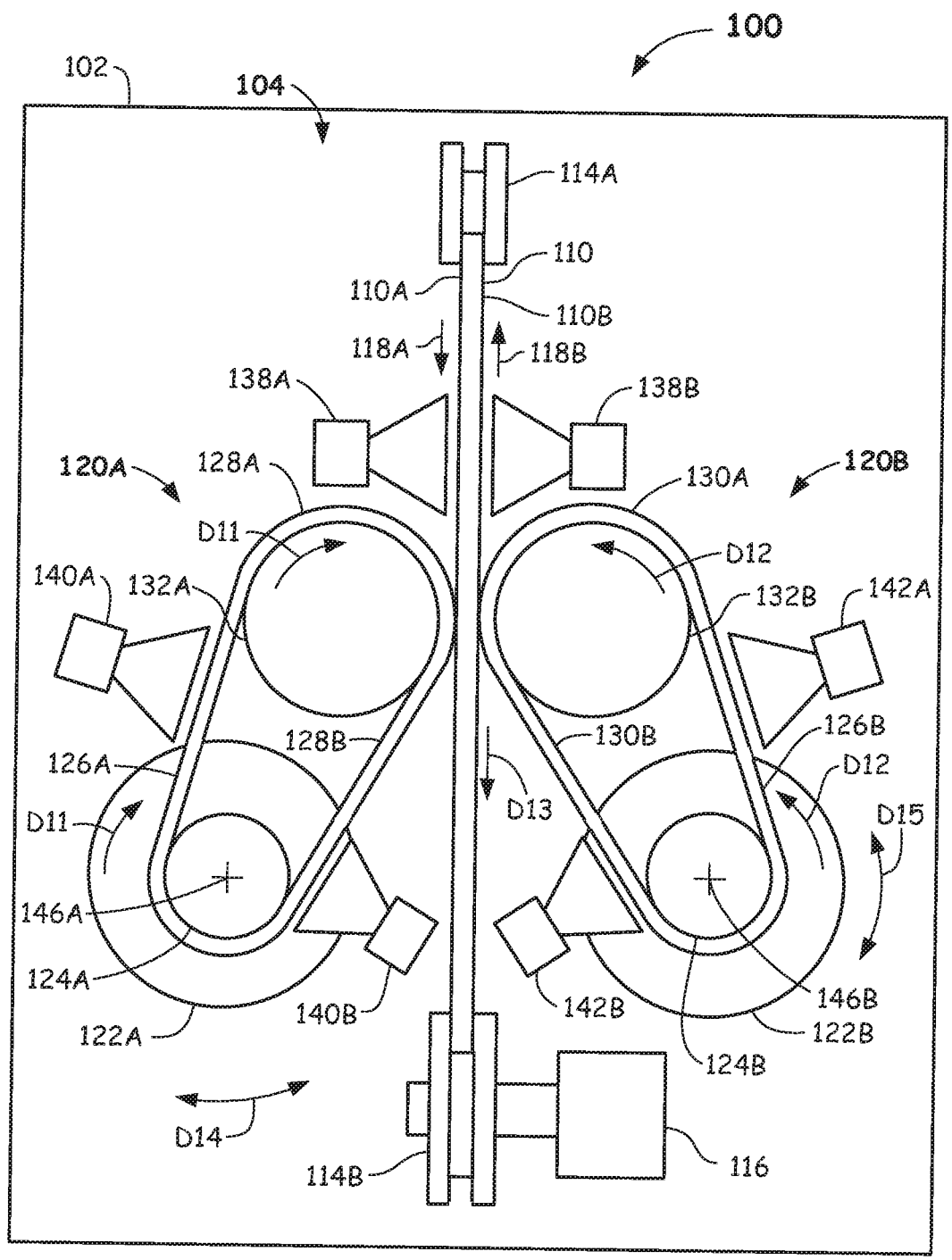
FIG. 1A illustrates a side elevation view of a substrate cleaner in a cleaning state according to embodiments disclosed herein.
Figure 1B:
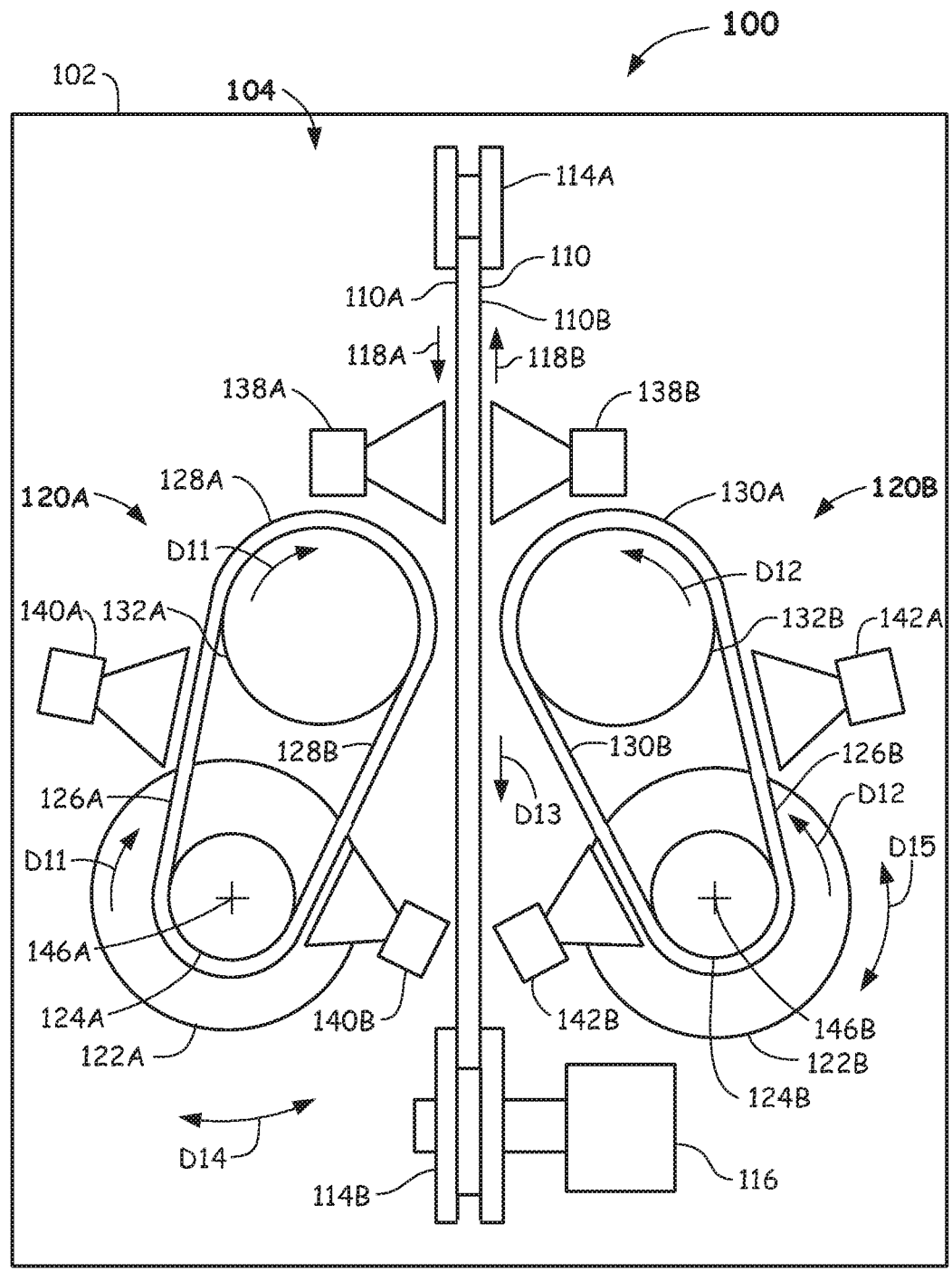
FIG. 1B illustrates a side elevation view of a substrate cleaner in a released state according to embodiments disclosed herein.

FIG. 1A illustrates a side view of a substrate cleaning device 100 in a cleaning state and FIG. 1B illustrates the substrate cleaning device 100 in a released state. Features of the substrate cleaning device 100 described herein may be applied to other substrate processing devices. The substrate cleaning device 100 may include a chamber body 102 (e.g., a brush box) defining a process volume 104. The chamber body 102 may be a tank that is configured to hold processing liquids, such as cleaning liquids used to clean a substrate 110 located therein. The substrate 110 may be supported within the chamber body 102 by a plurality of rollers, wherein a first roller 114A and a second roller 114B are shown in FIGS. 1A and 1B. The substrate 110 may be supported by more rollers (not shown).

The substrate 110 includes a first surface 110A and a second surface 110B opposite the first surface 110A that may be cleaned by the substrate cleaning device 100. In some embodiments, both the first surface 110A and the second surface 110B may be simultaneously cleaned and/or treated by the substrate cleaning device 100. In other embodiments, the first surface 110A and the second surface 110B may be cleaned and/or treated by the substrate cleaning device 100 consecutively, and/or a single surface (e.g., the first surface 110A or the second surface 110B) may be cleaned and/or treated by the substrate cleaning device 100. A drive mechanism 116 may be coupled to the second roller 114B or another supporting roller and may rotate the substrate 110 in a direction 118A and/or a direction 118B during cleaning processes.

The substrate cleaning device 100 may include a first brush assembly 120A and a second brush assembly 120B. The first brush assembly 120A may include a first motor 122A and a first roller 124A coupled to the first motor 122A. The second brush assembly 120B may include a second motor 122B and a first roller 124B coupled to the second motor 122B. In some embodiments, a single motor (not shown) may replace the first motor 122A and the second motor 122B and may rotate both the first roller 124A and the first roller 124B.

A first belt 126A may extend between the first roller 124A and a second roller 132A. A second belt 126B may extend between the first roller 124B and a second roller 132B. The first belt 126A may include an outer surface 128A and an inner surface 128B. The second belt 126B may also include an outer surface 130A and an inner surface 130B. The inner surface 128B of the first belt 126A may contact the first roller 124A and the second roller 132A. The inner surface 130B of the second belt 126B may contact the first roller 124B and the second roller 132B. For example, the inner surface 128B may include surface features, such as teeth and/or friction surfaces (not shown), that may contact the first roller 124A and/or the second roller 132A. Likewise, the inner surface 130B may include surface features, such as teeth or friction surfaces (not shown), that contact the first roller 124B and/or the second roller 132B.

Rotation of the first motor 122A moves the first belt 126A by way of the first roller 124A, wherein the first belt 126A rotates about the first roller 124A and the second roller 132A. Likewise, rotation of the second motor 122B moves the second belt 126B by way of the first roller 124B, wherein the second belt 126B rotates about the first roller 124B and the second roller 132B. In some embodiments, the substrate cleaning device 100 may include other rollers that may contact the first belt 126A and the second belt 126B. In some embodiments, the second roller 132A and/or the second roller 132B may be driven by one or more motors (in addition to or instead of first roller 124A and/or first roller 124B).

In the embodiments depicted in FIGS. 1A and 1B, the first motor 122A may rotate the first roller 124A in a direction D11 and the second motor 122B may rotate the first roller 124B in a direction D12. Accordingly, the first belt 126A moves in the direction D11 around the second roller 132A and the second belt 126B moves in the direction D12 around the second roller 132B. Thus, both the first belt 126A and the second belt 126B move in a direction D13 relative to the substrate 110. In some embodiments, the first belt 126A and/or the second belt 126B may move in a direction opposite the direction D13 relative to the substrate 110.

The outer surface 128A of the first belt 126A may be configured to contact the first surface 110A of the substrate 110. The outer surface 130A of the second belt 126B may be configured to contact the second surface 110B of the substrate 110. The outer surface 128A and the outer surface 130A may include the same surface features as conventional pads that may clean or otherwise process surfaces of substrates. In some embodiments, the first belt 126A and/or the second belt 126B may be made of materials commonly used in polishing pads. In some embodiments, the first belt 126A and/or the second belt 126B may be made of or include polyurethane and/or polyvinyl alcohol (PVA). The first belt 126A and/or the second belt 126B may be made of other materials. The first belt 126A and the second belt 126B may be made by 3-dimensional printing and/or other manufacturing processes. In some embodiments, the outer surfaces 128A and 130A of the first belt 126A and the second belt 126B may include different materials across their widths and/or their lengths. Such configurations enable different portions of the first belt 126A and the second belt 126B to perform different procedures on the substrate 110.

A first port 138A may be located proximate the first surface 110A of the substrate 110 and a second port 138B may be located proximate the second surface 110B. The first port 138A and the second port 138B may dispense and/or remove chemicals, such as cleaning chemicals or other fluids, to and/or from the first surface 110A and the second surface 110B of the substrate 110. For example, the first port 138A and the second port 138B may disperse fluids, such as gasses used in substrate processing, onto the substrate 110. In some embodiments, the fluids may include hydrofluoric acid (HF), ozone, hydrochloric acid (HCl), and/or ammonium hydroxide ($NH_4OH$). Other fluids may be used.

The first brush assembly 120A may include a first port 140A and a second port 140B located proximate the outer surface 128A of the first belt 126A. The second brush assembly 120B may include a first port 142A and a second port 142B located proximate the outer surface 130A of the second belt 126B. The first port 140A, the first port 142A, the second port 140B, and the second port 142B may dispense and/or remove chemicals, such as cleaning chemicals, to and/or from the outer surface 128A and the outer surface 130A of the first belt 126A and the second belt 126B. In some embodiments, the cleaning chemicals may include a base solution such as $NH_4OH$ at a concentration of approximately 0.05% to 1.0%. Greater or lesser concentrations of $NH_4OH$ or other base solutions may be used. In some embodiments, the first brush assembly 120A and/or the second brush assembly 120B may include conditioners (not shown) that condition the outer surface 128A and the outer surface 130A of the first belt 126A and the second belt 126B. For example, conditioners may apply deionized water or another solution to the outer surface 128A and the outer surface 130A of the first belt 126A and the second belt 126B.

The first brush assembly 120A may include a first pivot point 146A and the second brush assembly 120B may include a second pivot point 146B. In the embodiment depicted in FIGS. 1A and 1B, the first pivot point 146A may be located proximate the center of the first roller 124A and the second pivot point 146B may be located proximate the center of the first roller 124B. The first brush assembly 120A may pivot in a direction D14 about the first pivot point 146A and the second brush assembly 120B may pivot in a direction D15 about the second pivot point 146B. For example, motors and/or servos (not shown) may pivot the first brush assembly 120A about the first pivot point 146A and the second brush assembly 120B about the second pivot point 146B.

The substrate cleaning device 100 depicted in FIG. 1A is in a cleaning state. In the cleaning state, the first belt 126A and the second belt 126B are in contact with the first surface 110A and the second surface 110B, respectively, of the substrate 110. For example, the first belt 126A and the second belt 126B may perform processes on the first surface 110A and the second surface 110B of the substrate 110. Prior to or after the first belt 126A and/or the second belt 126B perform processes on the substrate 110, the substrate cleaning device 100 may be placed into the released state to enable the substrate 110 to be placed into and/or removed from the chamber body 102.

FIG. 1B illustrates the substrate cleaning device 100 in a released state. The first brush assembly 120A has rotated counterclockwise relative to the position of the first brush assembly 120A illustrated in FIG. 1A. The second brush assembly 120B has rotated clockwise relative to the second brush assembly 120B illustrated in FIG. 1B. Accordingly, when the substrate cleaning device 100 is in the released state, the first brush assembly 120A and the second brush assembly 120B are spaced from the substrate 110, which enables the substrate 110 to be removed from the chamber body 102. The released state of the substrate cleaning device 100 further enables a substrate to be placed within the chamber body 102. In some embodiments, the outer surface 128A of the first belt 126A and the outer surface 130A of the second belt 126B may be spaced about 10 mm to 15 mm from the first surface 110A and the second surface 110B of the substrate 110, although other spacings may be used.

Prior to operation, the substrate cleaning device 100 may be in the released state as illustrated in FIG. 1B. The substrate 110 may be placed into the chamber body 102 as shown in FIG. 1B. The substrate cleaning device 100 may then transition from the released state to the cleaning state as illustrated in FIG. 1A. Specifically, the first brush assembly 120A may pivot about the first pivot point 146A in a clockwise direction to a position where the outer surface 128A of the first belt 126A contacts the first surface 110A of the substrate 110. The second brush assembly 120B may pivot about the second pivot point 146B in a counterclockwise direction to a positon where the outer surface 130A of the second belt 126B contacts the second surface 110B of the substrate 110. In some embodiments, the first brush assembly 120A and the second brush assembly 120B may pivot simultaneously. For example, the first brush assembly 120A and the second brush assembly 120B may be coupled to a single motor or other moving device that pivots the first brush assembly 120A and the second brush assembly 120B simultaneously.

When the substrate cleaning device 100 is in the cleaning state the drive mechanism 116 may rotate the substrate 110. In addition, the first motor 122A may rotate the first belt 126A and the second motor 122B may rotate the second belt 126B to process the first surface 110A and the second surface 110B of the substrate 110. In some embodiments, the first motor 122A and/or the second motor 122B may monitor loads and/or torque applied to the first belt 126A and/or the second belt 126B to determine the force to be applied to the substrate 110 and/or when processing of the substrate 110 is complete. In some embodiments, the first belt 126A and/or the second belt 126B may apply between about 0.3 pounds per square inch (psi) and 8.0 psi to the substrate 110 during cleaning and/or treatment.

The use of the first belt 126A and the second belt 126B provides many advantages over traditional rollers and pads used to process substrates. For example, the surface area of a belt may be greater than the surface area of a conventional pad or roller. The greater surface area of the belts enables the belts to last longer than traditional pads and rollers, which may result in fewer belt changes than pad or roller changes in traditional substrate cleaning devices. As shown in FIGS. 1A and 1B, the first belt 126A extends between the first roller 124A and the second roller 132A and the second belt 126B extends between the first roller 124B and the second roller 132B. The extended length of the first belt 126A and the second belt 126B enables the application of conditioning procedures and/or chemicals to the first belt 126A and the second belt 126B. In some embodiments, conditioning may include the application of deionized water to a rough material, such as a diamond-coated disk, that is applied at a light pressure (e.g., 0.1 psi to 3 psi) to the first belt 126A and the second belt 126B. Other conditioning processes and/or pressures may be used. Thus, there are more options for locations of the first port 140A, the second port 140B, the first port 142A, and the second port 142B, which may condition and/or apply chemicals to the first belt 126A and the second belt 126B. In addition, the conditioning and/or application of chemicals may be applied to straight and/or curved sections of the first belt 126A and the second belt 126B.

Figure 2A:
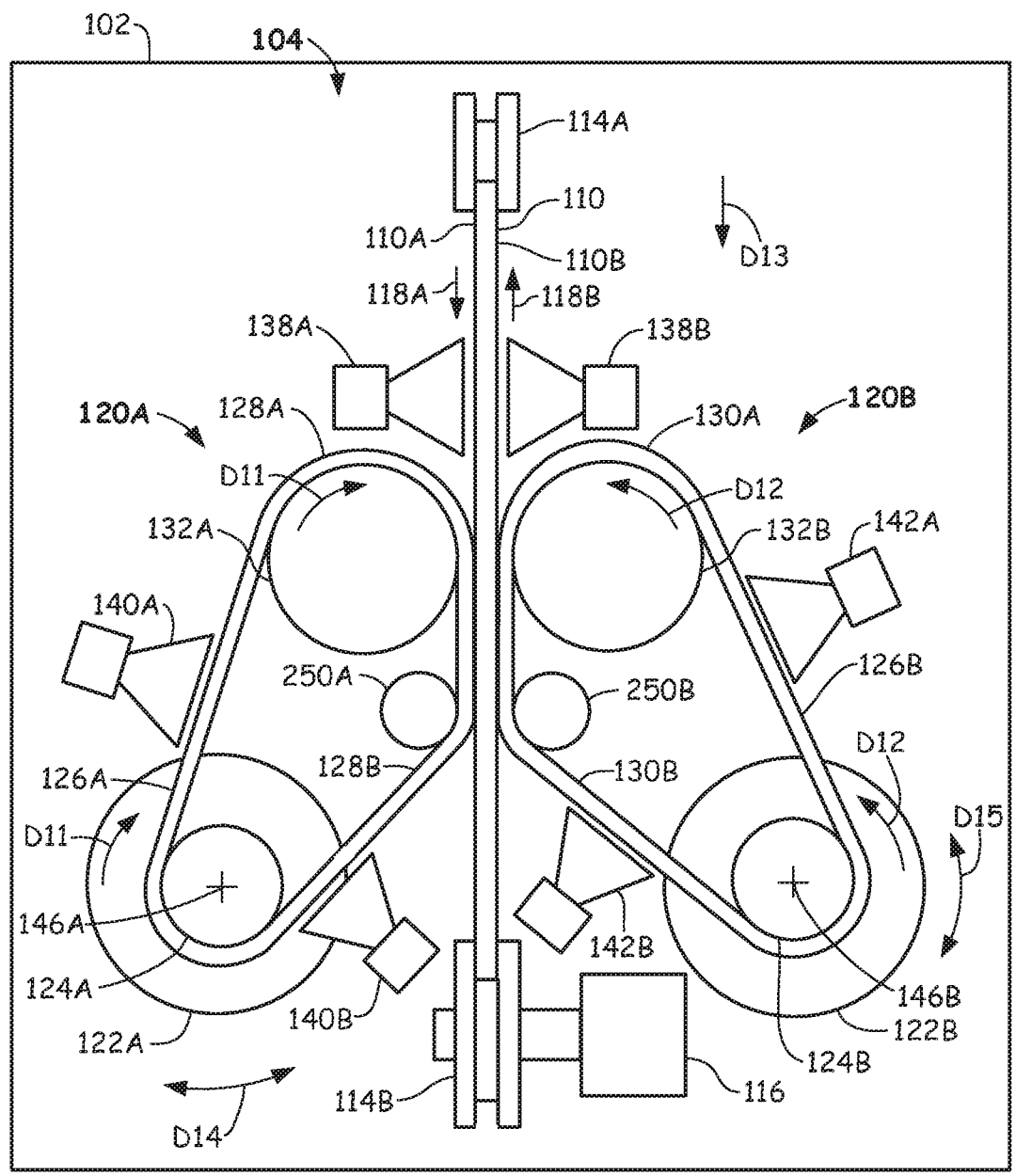
FIG. 2A illustrates a side elevation view of another embodiment of a substrate cleaner in a cleaning state according to embodiments disclosed herein.
Figure 2B:
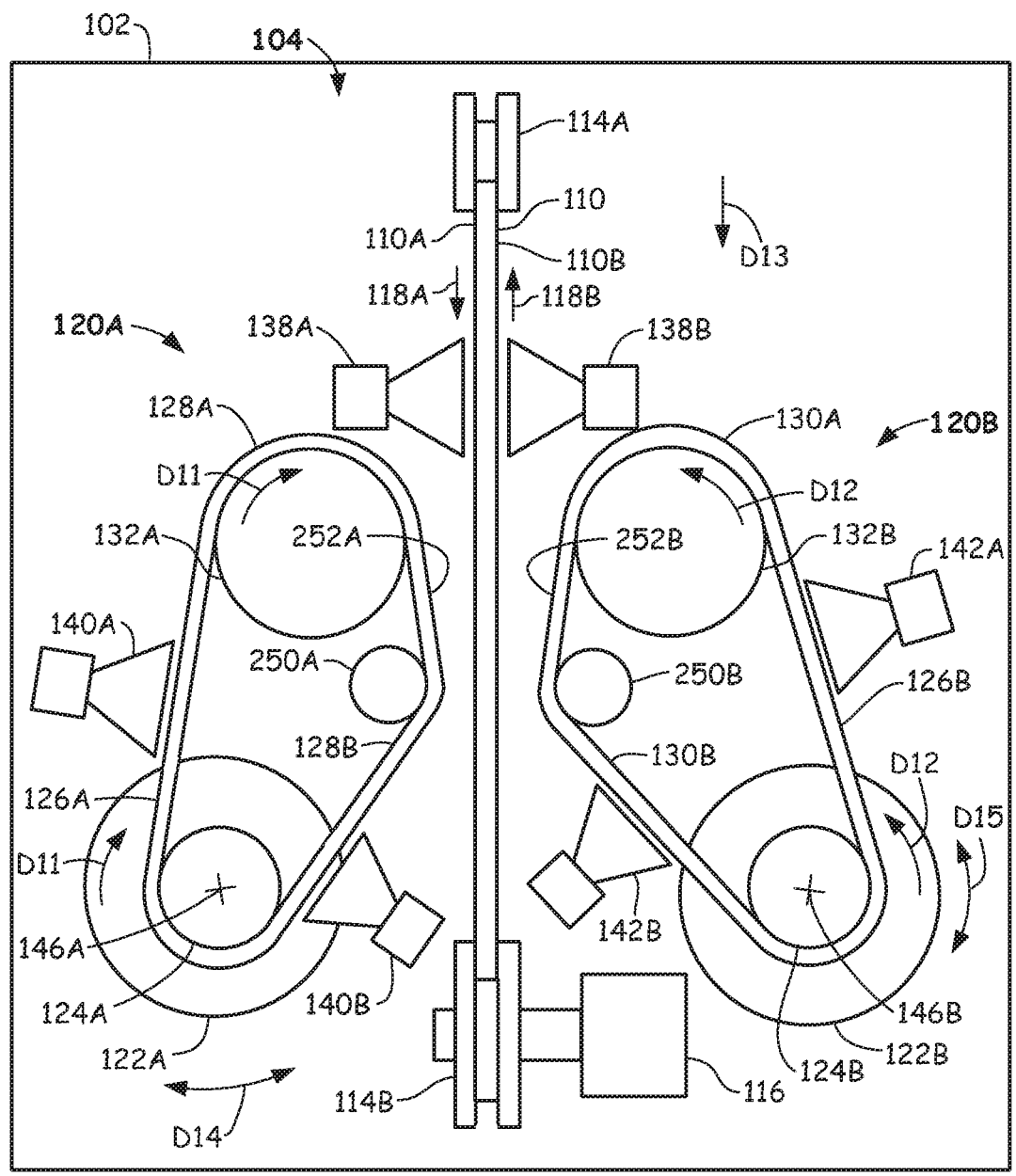
FIG. 2B illustrates a side elevation view of another embodiment of a substrate cleaner in a cleaning state according to embodiments disclosed herein.

Reference is now made to FIGS. 2A and 2B, which illustrate embodiments of the substrate cleaning device 100 with different belt configurations. In the embodiment of FIGS. 2A and 2B, the first brush assembly 120A includes a third roller 250A and the second brush assembly 120B includes a third roller 250B. The third roller 250A provides a straight section 252A (FIG. 2B) of the first belt 126A that is able to contact the first surface 110A of the substrate 110. The straight section 252A provides greater contact area between the first belt 126A and the first surface 110A relative to traditional rollers. The third roller 250B provides a similar straight section 252B (FIG. 2B) of the second belt 126B. In some embodiments, the straight section 252A and/or the straight section 252B may be between one eighth and seven eighths of the diameter of the substrate 110. In other embodiments, the straight section 252A and/or the straight section 252B may be between one eighth and one half of the diameter of the substrate 110. In yet other embodiments, the straight section 252A and/or the straight section 252B may be between one eighth and one quarter of the diameter of the substrate 110. Other straight section lengths may be used.

As illustrated in FIG. 2B, the embodiment of the substrate cleaning device 100 may rotate the first brush assembly 120A about the first pivot point 146A and the second brush assembly 120B about the second pivot point 146B to transition the substrate cleaning device 100 between the cleaning state and the released state.

Figure 3:
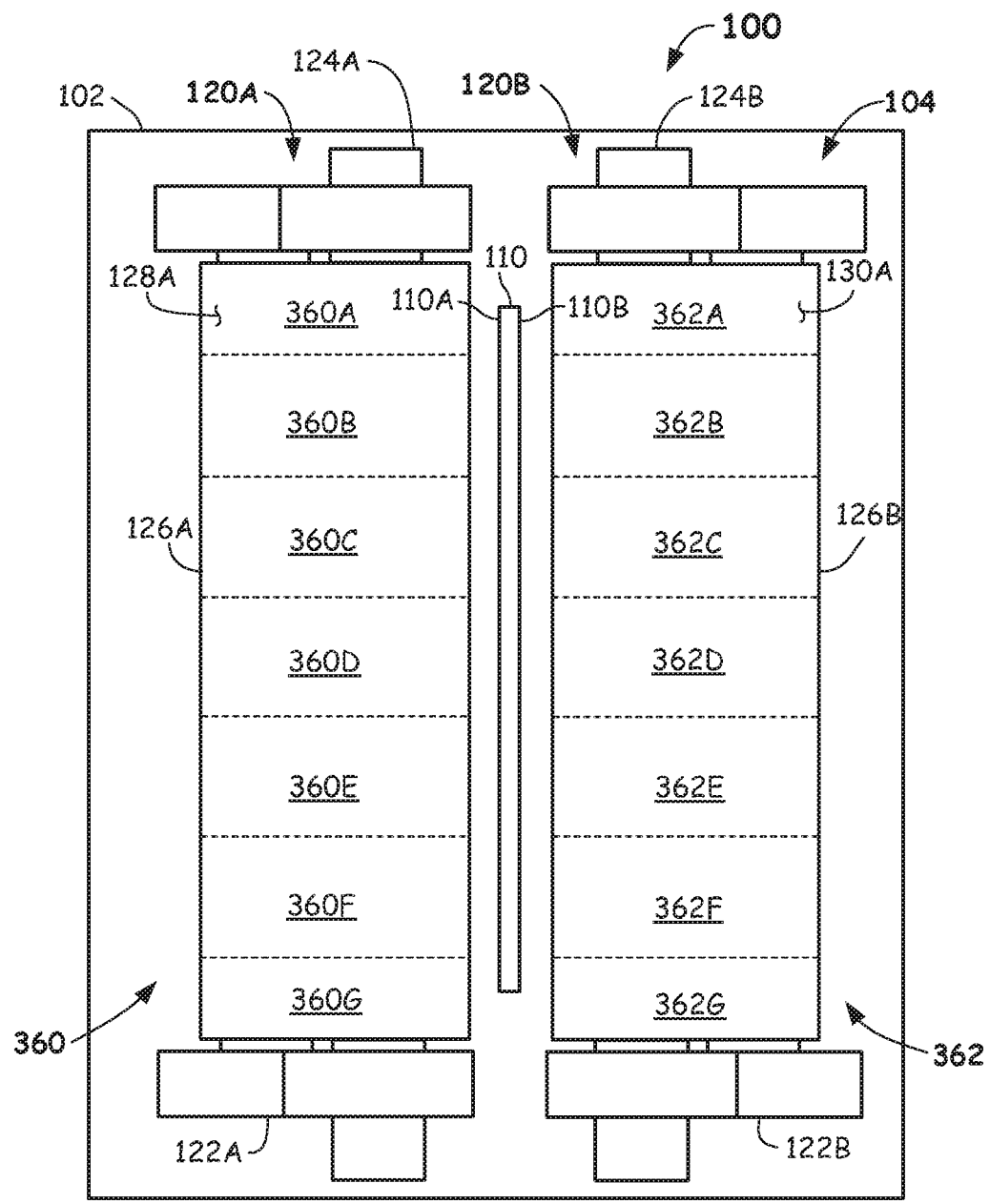
FIG. 3 illustrates a top view of a substrate cleaner including belts having zones according to embodiments disclosed herein.

Reference is now made to FIG. 3, which illustrates a top view of an embodiment of the substrate cleaning device 100. In the embodiment of FIG. 3, the first belt 126A and the second belt 126B are partitioned into a plurality of zones. For example, the first belt 126A may include a plurality of zones 360 that are referenced individually as zones 360A-360G. The outer surface 128A of the first belt 126A may have different materials or different configurations of materials in each of the zones 360A-360G. In a similar manner, the outer surface 130A of the second belt 126B may be partitioned into a plurality of zones 362 that are referenced individually as zones 362A-362G. The outer surface 128A and the outer surface 130A may have a fewer number or a greater number of zones 360 and zones 362 than illustrated in FIG. 3 (e.g., 2, 3, 4, 5, 6, 8, 9, etc., zones 360 and zones 362).

The zones 360A-360G of the outer surface 128A and the zones 362A-362G of the outer surface 130A may have different materials or different configurations of materials. Accordingly, the zones 360A-360G and the zones 362A-362G enable different portions of the first belt 126A and the second belt 126B to perform different processes on the substrate 110. The materials of each of the zones 360A-360G may be or include PVA or similar materials. The material of at least two of the zones 360A-360G may be have different durometers. In addition, at least two of the zones 360A-360G may have different surface finishes. In other embodiments, individual pressurized membranes may be located under at least one of the zones 360A-360G and the individual pressurized membranes may be pressurized independently.

Figure 4:
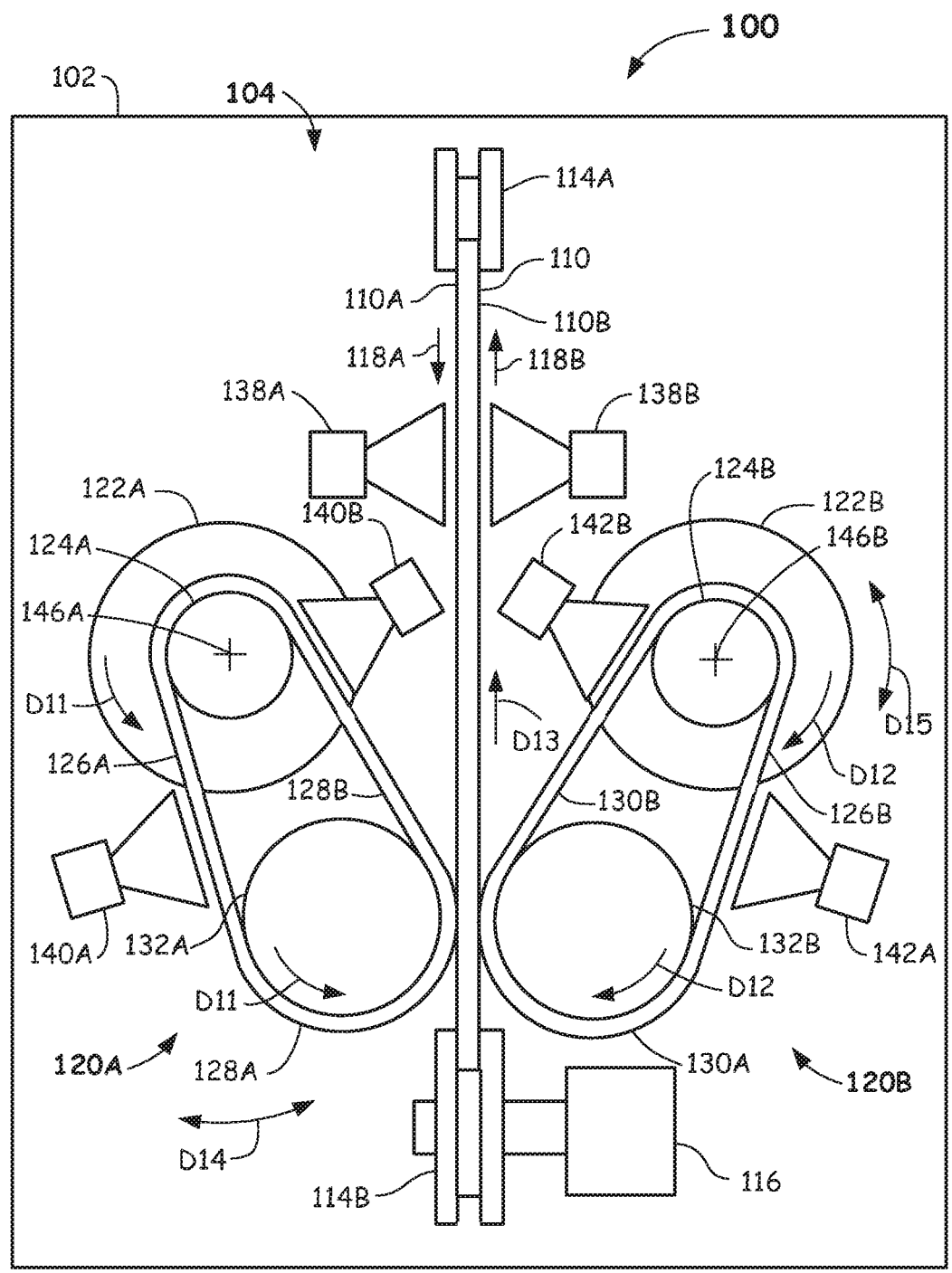
FIG. 4 illustrates a side elevation view of another embodiment of a substrate cleaner according to embodiments disclosed herein.

Reference is now made to FIG. 4, which illustrates an embodiment of the substrate cleaning device 100 wherein the first motor 122A and the second motor 122B are located above the second roller 132A and the second roller 132B. This configuration of the substrate cleaning device 100 may provide different cleaning and/or processing of the substrate 110. For example, the chemicals applied to the substrate 110 may accumulate and/or distribute differently onto the substrate 110, which may improve performance.

Figure 5:
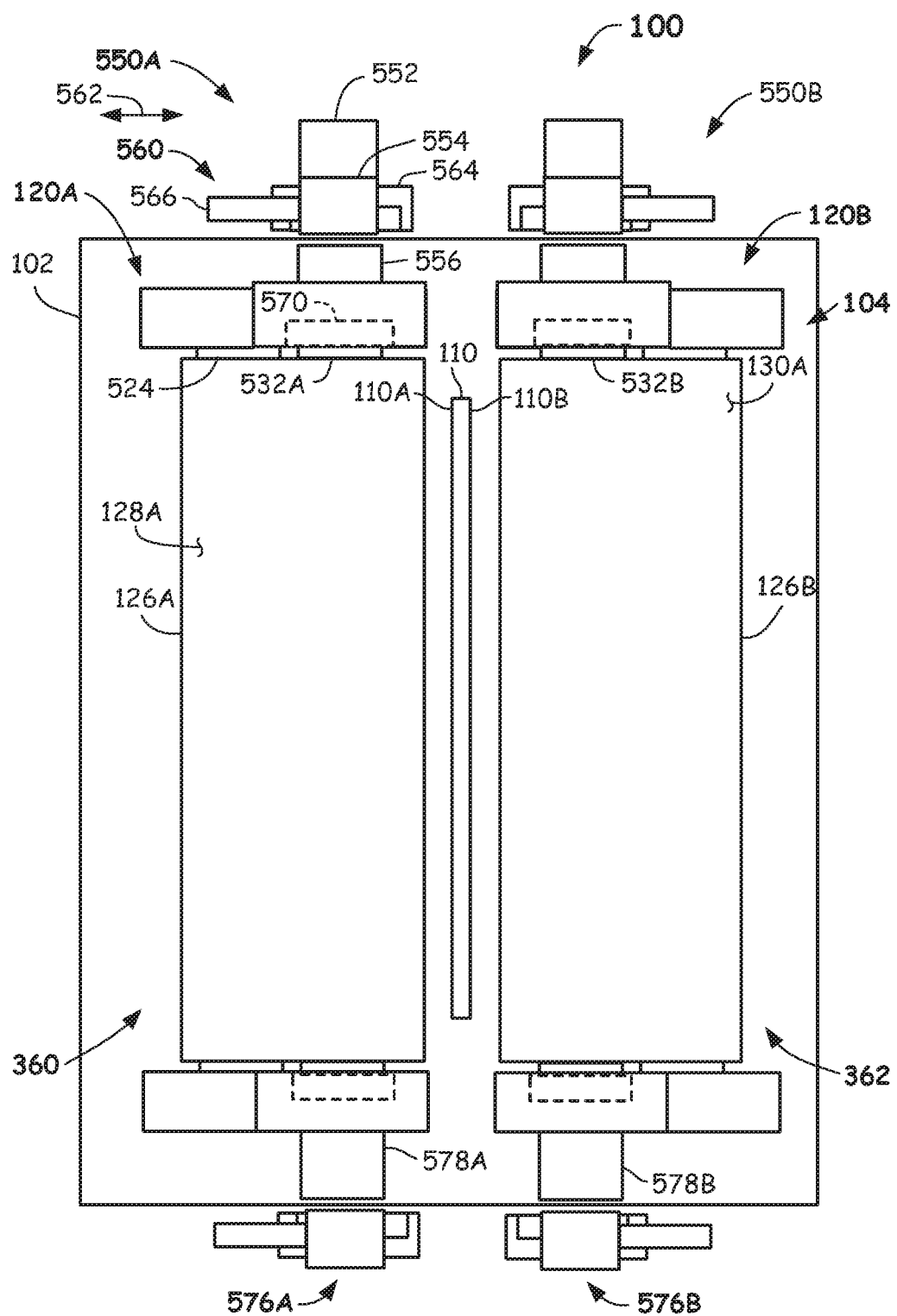
FIG. 5 illustrates a top view of a substrate cleaner including magnetic coupling between motors and belts according to embodiments disclosed herein.

Reference is now made to FIG. 5, which illustrates the substrate cleaning device 100 including magnetic coupling between motors and rollers. A first drive assembly 550A and a second drive assembly 550B may be located external to the chamber body 102. The first drive assembly 550A may be substantially similar or identical to the second drive assembly 550B. The following description of components of the first drive assembly 550A may be applicable to the second drive assembly 550B. The first drive assembly 550A may include a motor 552 that may be coupled to and may rotate a first magnetic coupler 554. The first magnetic coupler 554 may be magnetically coupled to a second magnetic coupler 556 that may be coupled to a roller 532A. The first belt 126A may be rotatable about the roller 532A and a roller 524. The motor 552 may rotate the first magnetic coupler 554, which may cause the second magnetic coupler 556 to rotate. The second magnetic coupler 556 may be coupled to the roller 532A, which may rotate as the second magnetic coupler 556 rotates. Accordingly, the first belt 126A may rotate about the roller 532A and the roller 524.

The first drive assembly 550A may be moveably coupled to a moving mechanism 560 that may move the first drive assembly 550A along an axis 562. For example, movement of the first drive assembly 550A along the axis 562 may transition the first brush assembly 120A between the cleaning state and the released state. In some embodiments, the moving mechanism 560 may include a linear slide 564, wherein the first drive assembly 550A may be coupled to and slide relative to the linear slide 564. An actuator 566, such as an air cylinder, may move the first drive assembly 550A relative to the linear slide 564. In some embodiments, other devices may move the first drive assembly 550A along the axis 562.

Flexure mounts 570 may be attached to the first roller 532A and may provide for movement of the first roller 532A, such as along the axis 562. The movement of the first roller 532A may enable the first belt 126A to conform to the first surface 110A of the substrate 110.

Magnetic retainers may be located opposite the first drive assembly 550A and the second drive assembly 550B. For example, a first magnetic retainer 576A may be located opposite the first drive assembly 550A and a second magnetic retainer 576B may be located opposite the second drive assembly 550B. In some embodiments, the first magnetic retainer 576A and/or the second magnetic retainer 576B may be located external to the chamber body 102. In other embodiments, the first magnetic retainer 576A and/or the second magnetic retainer 576B may be located within the chamber body 102. The first magnetic retainer 576A and the second magnetic retainer 576B may be similar or identical to the first drive assembly 550A, except the first magnetic retainer 576A and the second magnetic retainer 576B may not include a motor, in some embodiments. The first magnetic retainer 576A may magnetically couple to a magnetic coupler 578A on the roller 532A and the second magnetic retainer 576B may magnetically couple to a magnetic coupler 578B on the roller 532B. The first magnetic retainer 576A and/or the second magnetic retainer 576B may move the roller 532A and/or the roller 532B in an identical or similar manner as the first drive assembly 550A. In some embodiments, the first drive assembly 550A and the first magnetic retainer 576A may be coupled together and may move together. Likewise, the second drive assembly 550B and the second magnetic retainer 576B may be coupled together and may move together. Such coupling may maintain the first belt 126A and/or the second belt 126B in fixed orientations relative to the substrate 110.

The magnetic coupling via the first drive assembly 550A, the second drive assembly 550B, the first magnetic retainer 576A, and/or the second magnetic retainer 576B may enable movement of the first belt 126A and/or the second belt 126B by mechanisms located exterior to the chamber body 102. For example, the first belt 126A and/or the second belt 126B may rotate by way of the first drive assembly 550A and/or the second drive assembly 550B, which may be located external to the chamber body 102. Furthermore, the first brush assembly 120A and/or the second brush assembly 120B may transition between the cleaning state and the released state by movement of the first drive assembly 550A, the second drive assembly 550B, the first magnetic retainer 576A, and/or the second magnetic retainer 576B along the axis 562.

Figure 6:
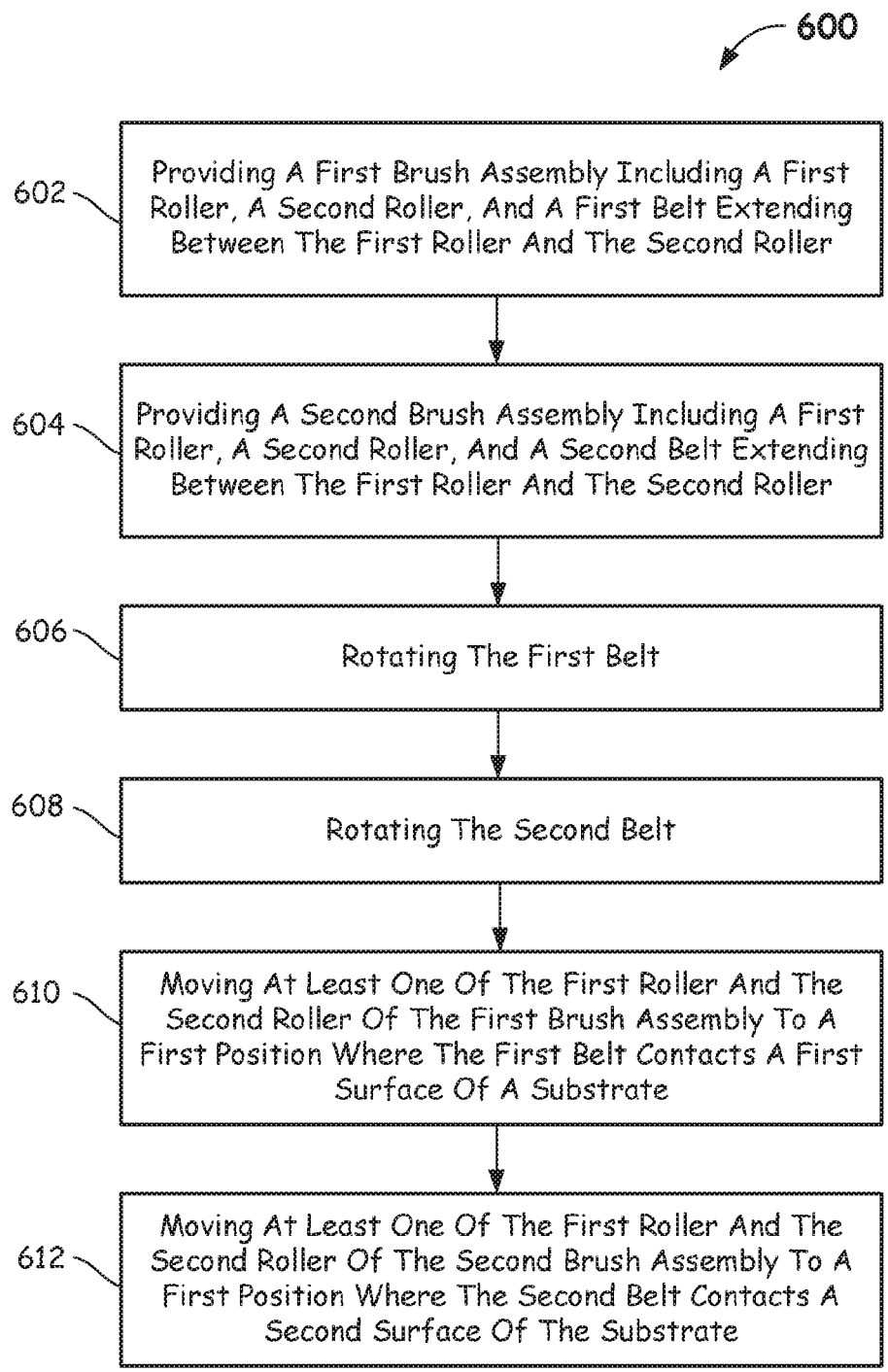
FIG. 6 illustrates a flowchart describing a method of cleaning substrates according to embodiments disclosed herein.

In another aspect, a method of cleaning substrates (e.g., substrate 110) is illustrated in the flowchart 600 of FIG. 6. The method includes at 602, providing a first brush assembly (e.g., first brush assembly 120A) including a first roller (e.g., first roller 124A), a second roller (e.g., second roller 132A), and a first belt (e.g., first belt 126A) extending between the first roller and the second roller. The method includes at 604, providing a second brush assembly (e.g., second brush assembly 120B) including a first roller (e.g., first roller 124B), a second roller (e.g., second roller 132B), and a second belt (e.g., second belt 126B) extending between the first roller and the second roller. The method includes at 606, rotating the first belt. The method includes at 608, rotating the second belt. The method includes at 610 moving at least one of the first roller and the second roller of the first brush assembly to a first position where the first belt contacts a first surface (e.g., first surface 110A) of a substrate (e.g., substrate 110). The method includes at 612, moving at least one of the first roller and the second roller of the second brush assembly to a first position where the second belt contacts a second surface (e.g., second surface 110B) of the substrate.

The foregoing description discloses only example embodiments. Modifications of the above-disclosed apparatus and methods which fall within the scope of this disclosure will be readily apparent to those of ordinary skill in the art.

What is claimed is:

1. A substrate cleaning device, comprising:
a chamber body configured to hold a substrate;
a first brush assembly including a first roller, a second roller, a third roller, and a first belt extending between the first roller, the second roller, and the third roller, wherein the first belt includes a first straight section between the second roller and the third roller of the first brush assembly, and wherein the second roller and the third roller of the first brush assembly are movable between a first position where the second roller and third roller of the first brush assembly abut the substrate through the first belt such that an entirety of the first straight section of the first belt between the second roller and the third roller of the first brush assembly contacts a first surface that is a flat major diameter surface of the substrate disposed in the chamber body and a second position where the first belt is spaced from the first surface; and a second brush assembly including a first roller, a second roller, a third roller, and a second belt extending between the first roller, the second roller, and the third roller, wherein the second belt includes a second straight section between the second roller and the third roller of the second brush assembly, and wherein the second roller and the third roller of the second brush assembly are movable between a first position where the second roller and the third roller of the second brush assembly abut the substrate through the second belt such that an entirety of the second straight section of the second belt between the second roller and the third roller of the second brush assembly contacts a second surface of the substrate that is an opposite flat major diameter surface of the substrate and a second position where the second belt is spaced from the second surface.

2. The substrate cleaning device of claim 1, further comprising at least one port configured to dispense a fluid onto at least one of the first belt and the second belt.

3. The substrate cleaning device of claim 1, further comprising at least one port configured to dispense a fluid on at least one of the first surface of the substrate and the second surface of the substrate.

4. The substrate cleaning device of claim 1, further comprising one or more magnetic couplers located external to the chamber body and magnetically coupled to at least one of the second roller of the first brush assembly and the second roller of the second brush assembly.

5. The substrate cleaning device of claim 4, wherein the one or more magnetic couplers are configured to rotate at least one of the second roller of the first brush assembly and the second roller of the second brush assembly by way of magnetic coupling.

6. The substrate cleaning device of claim 4, wherein the one or more magnetic couplers are configured to move at least one of the second roller of the first brush assembly and the second roller of the second brush assembly between the first position and the second position by way of magnetic coupling.

7. The substrate cleaning device of claim 1, wherein the first belt and the second belt each include an outer surface, and wherein the outer surface of at least one of the first belt and the second belt includes a plurality of zones, the plurality of zones including different materials.

8. The substrate cleaning device of claim 7, wherein the different materials have different durometers.

9. The substrate cleaning device of claim 1, wherein the first belt includes a plurality of zones, at least one of the plurality of zones including a pressurized membrane beneath the first belt.

10. The substrate cleaning device of claim 1, further comprising a motor coupled to the first roller of the first brush assembly.

11. The substrate cleaning device of claim 10, wherein the first roller of the first brush assembly is located above the second roller.

12. The substrate cleaning device of claim 10, wherein the first roller of the first brush assembly is located below the second roller.

13. A substrate cleaning device, comprising:
a chamber body configured to hold a substrate;
a first brush assembly including a first roller, a second roller, a third roller, and a first belt extending between the first roller, the second roller, and the third roller, wherein the first belt includes a first straight section between the second roller and the third roller, and a second straight section between the first roller and the second roller, and wherein at least two of the first roller, the second roller, and the third roller being movable between a first position where the first straight section of the first belt between the second roller and the third roller contacts a first surface of the substrate disposed in the chamber body and a second position where the first belt is spaced from the first surface;
a second brush assembly including a first roller, a second roller, a third roller and a second belt extending between the first roller, the second roller, and the third roller, wherein the second belt includes a third straight section between the second roller and the third roller, and wherein the second roller and the third roller are movable being movable between a first position where the second belt contacts a second surface of the substrate and a second position where the second belt is spaced from the second surface; and
at least one port configured to dispense a fluid onto the second straight section of the first belt.

14. The substrate cleaning device of claim 13, wherein the at least one port is further configured to rotate between a third position when an entirety of the first straight section contacts the first surface and a fourth position when the first belt is spaced from the first surface.

* * * * *